United States Patent [19]

Iranmanesh

[11] Patent Number: 5,236,863
[45] Date of Patent: Aug. 17, 1993

[54] ISOLATION PROCESS FOR VLSI
[75] Inventor: Ali Iranmanesh, Sunnyvale, Calif.
[73] Assignee: National Semiconductor Corporation, Santa Clara, Calif.
[21] Appl. No.: 891,886
[22] Filed: Jun. 1, 1992
[51] Int. Cl.[5] ............................................ H01L 21/20
[52] U.S. Cl. ...................................... 437/90; 437/72; 437/73; 437/89; 148/DIG. 50
[58] Field of Search ...................... 437/72, 73, 89, 90, 437/33, 78; 148/DIG. 50

[56] References Cited
U.S. PATENT DOCUMENTS

| 4,385,975 | 5/1983 | Chu et al. | 156/643 |
| 4,509,249 | 4/1985 | Goto et al. | 437/90 |
| 4,689,656 | 8/1987 | Silvestri et al. | 437/62 |
| 4,728,624 | 3/1988 | Silvestri et al. | 437/90 |
| 4,745,081 | 5/1988 | Beyer et al. | 437/78 |
| 4,820,654 | 4/1989 | Lee | 437/90 |
| 4,900,692 | 2/1990 | Robinson | 437/90 |
| 4,926,233 | 5/1990 | Hutter | 357/47 |
| 4,929,996 | 5/1990 | Hutter | 357/55 |

FOREIGN PATENT DOCUMENTS 0155698 9/1985 European Pat. Off. .

Primary Examiner—Brian E. Hearn
Assistant Examiner—Trung Dang
Attorney, Agent, or Firm—Gail W. Woodward

[57] ABSTRACT

A process for forming an IC isolation trench pattern wherein the trenches have varying widths and are filled with near intrinsic single crystal silicon. Thus, the wiring that passes over the trenches has low capacitance and active circuit devices having improved high frequency performance can be fabricated into the silicon in the trenches. This increases the utilization of surface area thereby increasing active device density for VLSI applications.

8 Claims, 3 Drawing Sheets

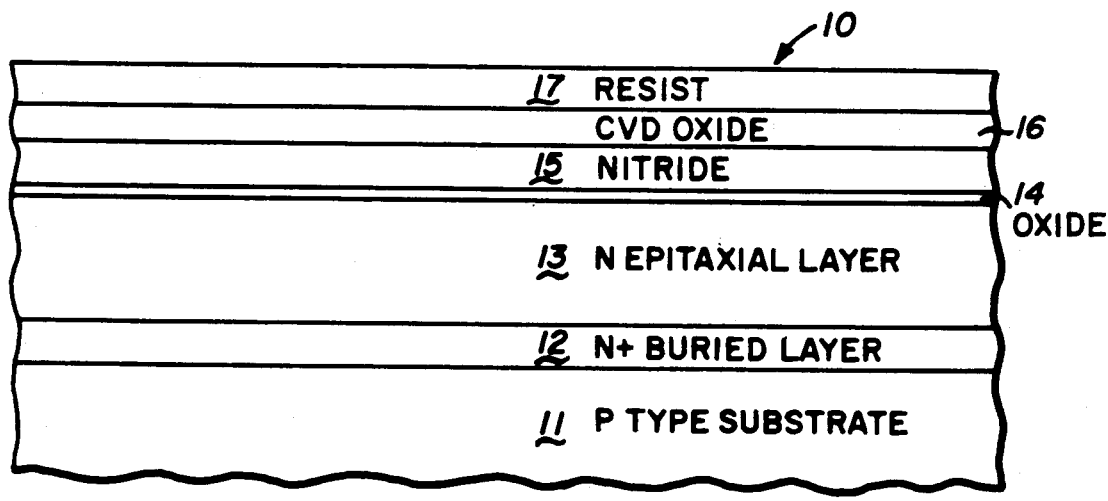
Fig_1
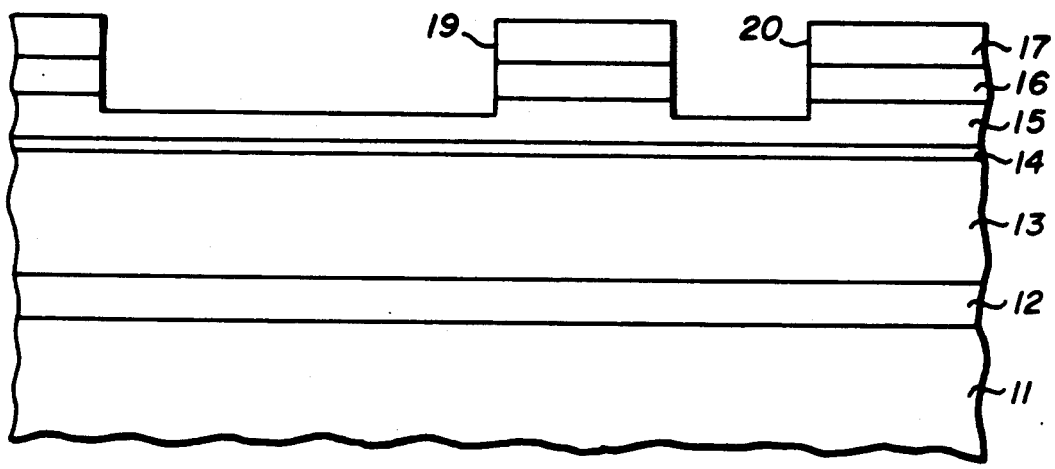
Fig_2
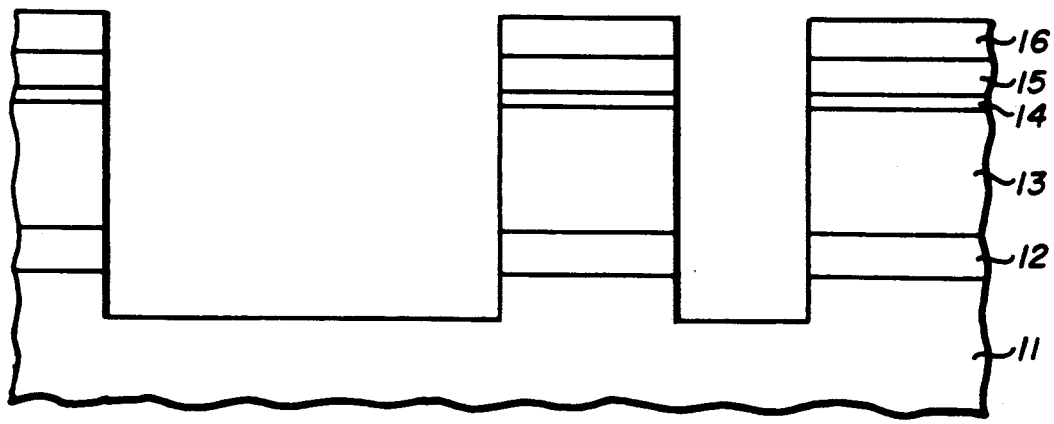
Fig_3

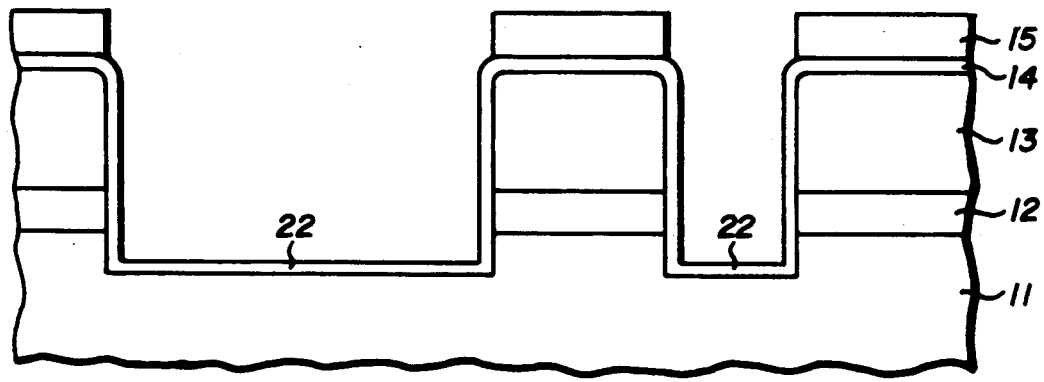
Fig_4
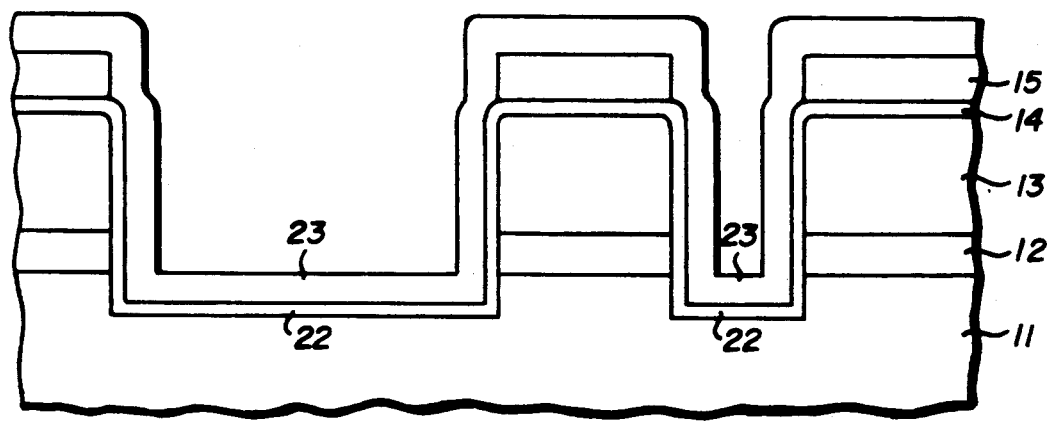
Fig_5
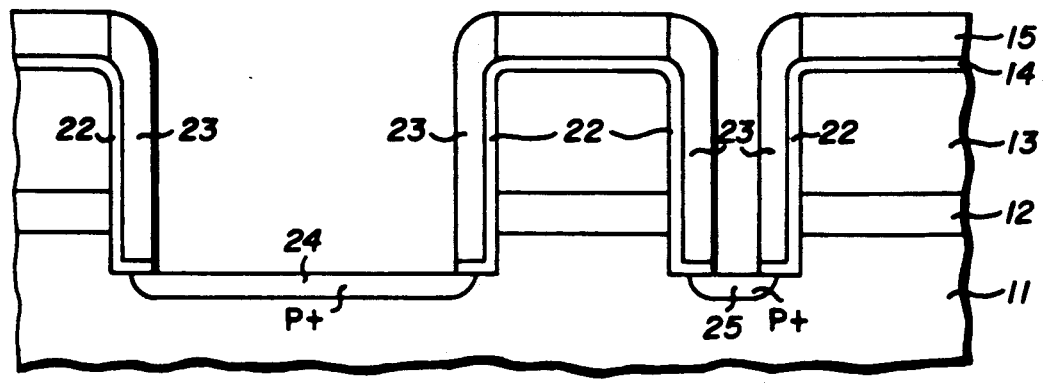
Fig_6

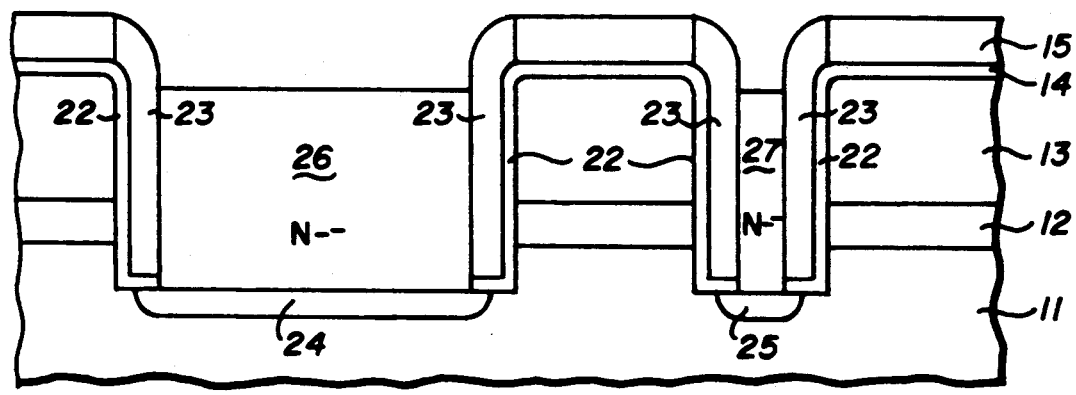
Fig_7
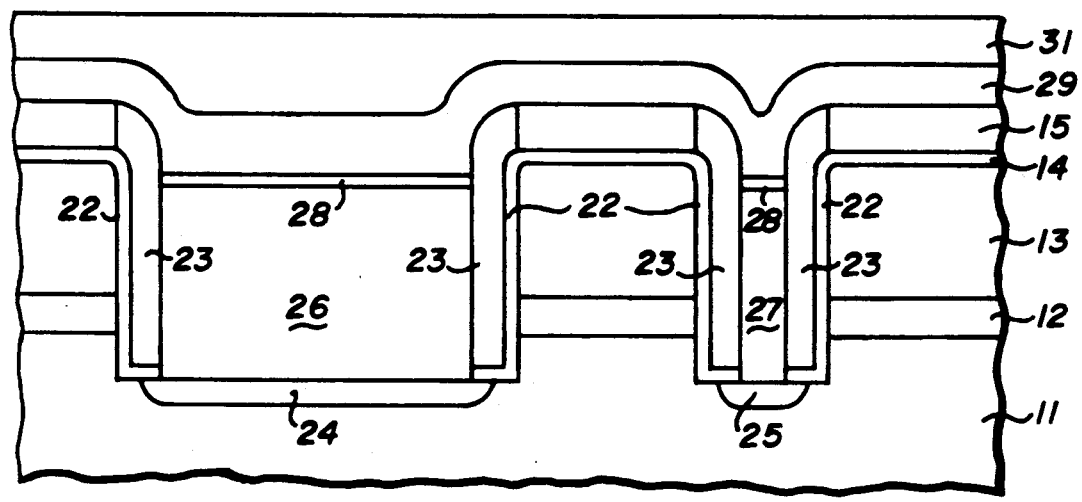
Fig_8
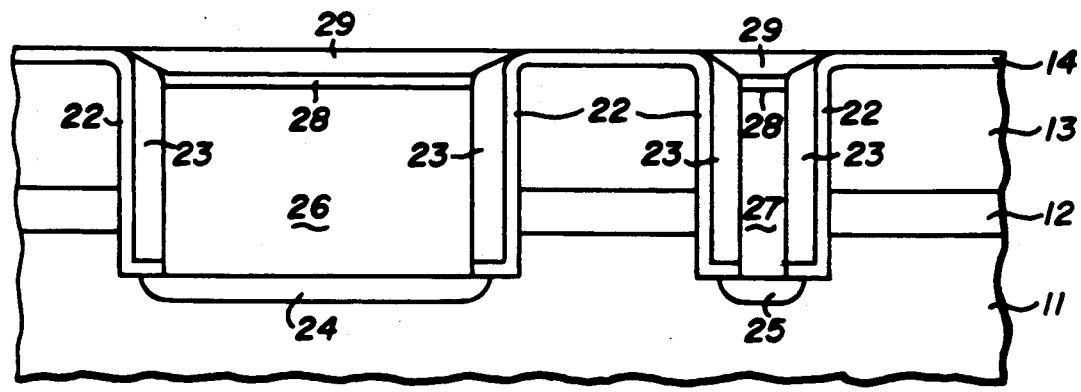
Fig_9

ISOLATION PROCESS FOR VLSI

BACKGROUND OF THE INVENTION

The invention is related to the isolation of individual elements in integrated circuit (IC) devices. It is mainly concerned with very large scale integration (VLSI) wherein a large number of circuits are fabricated simultaneously on a silicon wafer using planar photolithographic technology. Each individual circuit can be quite complex because it can contain a relatively large number of components. Typically, the individual components are isolated from each other by the use of reverse biased PN junctions which surround the devices. Recently it has become a common practice to employ what is called trench isolation wherein the devices are surrounded by trenches which are slots etched into the silicon wafer and extend into the bulk of the structure to completely penetrate the device structure and thereby help to isolate it. The devices still employ PN junction isolation over their main area contact with the semiconductor wafer, but their peripheral surface areas are trench isolated. Since anisotropic etching has become commonplace it has been found that deep trenches can be made narrower than the conventional isolation diffusion used in the past. This greatly reduces surface area requirements and therefore increases the device density for VLSI.

Typically, the isolation trenches are backfilled so that surface planarity is maintained. Chu et al. U.S. Pat. No. 4,385,975 is directed to the filling of both narrow and wide trenches with silicon dioxide and the planarization of the substrate wafer surface. This approach is useful because it had been found that when a process was optimized for one size of trench it was dificult to accommodate other trench widths on the same wafer. The teaching in this patent is incorporated herein by reference.

Chu et al. point out that capacitive coupling between the surface conductors and the substrate can be reduced by increasing the thickness of the dielectric material that separates the substrate from the conductors. Thus, it is desirable to employ wide trenches where the devices are widely separated. In other words, the circuits are capable of higher frequency operation if the conductors are located over dielectric filled trenches, in the regions between devices, rather than over the conventional planar oxide. However, the use of silicon dioxide filled trenches precludes the formation of active devices within the trench areas.

SUMMARY OF THE INVENTION

It is an object of the invention to employ trench isolation of IC devices wherein the trenches are filled with near intrinsic single crystal silicon which serves as an insulating trench fill.

It is a further object of the invention to provide a process for forming single crystal silicon backfills in IC devices employing trench isolation.

It is a still further object of the invention to employ nearly intrinsic silicon as the backfill material in a trench isolation process used to create IC devices for VLSI wherein both narrow and wide trenches are present.

These and other objects are achieved by employing the following process steps. The starting material is a silicon wafer composed of a P type substate wafer having grown thereon a first layer of N+ silicon suitable for buried layer device use and a second layer of N type silicon suitable for use in the active circuit elements. These two layers are grown epitaxially upon the P type substrate and have thicknesses that are designed to provide suitable device characteristics. In the process of the invention a first thin layer of silicon dioxide is created over the wafer surface. Then a layer of silicon nitride is applied. A third layer, composed of deposited silicon dioxide, is applied over the silicon nitride.

The wafer is provided with a photoresist which is contoured to expose the third layer in the pattern of the isolation trenches which includes wide as well as narrow trenches. This photoresist is employed in the photolithographic etching which removes the silicon dioxide in the third substrate layer where trenches are to be created. The photoresist can then be removed and the wafer placed in a dry etch chamber wherein the trenches are created. This etch is anisotropic in that etching only occurs vertically with the third layer oxide acting to define the etching. The etching proceeds through the silicon nitride, the thin silicon dioxide first layer and the silicon itself. Etching is continued to form the trenches until the N+ layer is fully penetrated and the trenches extend into the original P type substrate wafer. This leaves the wafer with a fully developed trench pattern.

Then, the masking oxide used in trench definition is removed leaving the silicon nitride in the regions between trenches as an etch stop. The wafer is then subjected to a cleaning step which removes any residual oxide from the exposed silicon and also removes the thin etch-damaged surface therefrom. Then, a thin protective oxide is grown on the exposed silicon. This oxide continues the original first layer thin oxide so that all of the wafer surface is covered by a thin oxide. Then, a spacer oxide layer is deposited over the wafer so that a layer of silicon dioxide covers the wafer and is also located inside the trenches to cover the thin protective oxide. This layer has a thickness that is insufficient to completely fill the narrowest of trenches.

The wafer is then subjected to an anisotropic etch that removes the previously applied spacer oxide and its underlying thin protective oxide. Thus, the silicon in the bottoms of the trenches is exposed. In the regions between trenches, the silicon nitride acts as an etch stop so that only the deposited spacer and thin oxides are removed. The wafer is then subjected to an impurity diffusion stop in which a P type impurity is applied in a vapor ambient so that the bottoms of the trenches are doped P+. This diffusion causes the P+ doping to extend into the P type substrate wafer and to extend slightly under the spacer oxide. At this point, the trench bottoms are terminated with a P+ silicon surface.

The wafer is then subjected to a selective epitaxial silicon deposition step. The deposition is selective in that silicon is grown only upon exposed silicon and none will deposit on the oxide or nitride surfaces. Thus, silicon is deposited only at the trench bottoms and the deposition conditions adjusted so that the deposition is epitaxial. This deposition is continued until the trenches are almost filled. The deposited silicon is slightly doped with N type impurities so that it is nearly intrinsic and therefore of high or nearly insulator resistivity. Thus, the trenches are nearly filled with single crystal silicon that forms a PN junction with the P+ doped regions of the substrate.

Then, the deposited silicon plugs are provided with a thin protective oxide and the wafer surface is then covered with a deposited silicon dioxide coating. This coating follows the wafer surface contours and is made thicker than the surface depressions that result from the trenches being not quite filled with silicon. Then, a photoresist is applied over the oxide as is conventional in a planarization process wherein a final surface removal step eliminates the surface coatings down to the original first layer thin oxide that existed underneath the silicon nitride layer throughout the trench process. Since this final layer removal step acts equally on all of the coatings, the result is a highly planarized wafer surface. This surface is highly amenable to conventional planar photolithographic processing and planar devices can then be created in the wafer surface. These devices can be created in the original N type epitaxial layer produced upon the substrate wafer and other active devices can be created in the single crystal plugs of silicon.

BRIEF DESCRIPTION OF THE DRAWING

FIGS. 1 through 9 represent a fragment of a silicon wafer which is processed to produce trench isolation of portions of the wafer surface and the backfilling of the trenches with epitaxial silicon. The drawing is not to scale. The vertical dimensions are exaggerated to better show the invention.

DESCRIPTION OF THE INVENTION

FIG. 1 shows a fragmentary cross section of a silicon wafer 10 in which a substrate 11 is composed of a basic P type starting element which has an N+ layer 12 located on top followed by an N type epitaxial top layer 13. Layer 12 is sufficiently conductive to serve as a buried layer useful in fabricating PN junction isolated transistors. Layer 13 has a resistivity selected to provide the collector regions of the transistors to be created in subsequent processing.

The first step is the creation of layer 14 which is composed silicon dioxide and is relatively thin. Layer 14 is typically produced by thermal oxidation and is about 250 Å thick. Then a layer of silicon nitride ($Si_3N_4$) 15 is deposited to a thickness of about 1250 Å. The silicon nitride layer 15 is overcoated with a chemical vapor deposited (CVD) layer 16 of silicon dioxide 16 about 1000 Å thick.

At this point, a photoresist 17 is applied over the upper surface of layer 16. As shown in FIG. 2, the photoresist is photolithographically removed to expose layer 16 in those regions where trenches are to be created. Two openings are shown. Opening 19 represents a wide trench and opening 20 represents a narrow trench.

As shown in FIG. 2, the photoresist is employed to localize the removal of layer 16. An etch is employed that will attack silicon nitride much more slowly than silicon dioxide. Thus, layer 15 will act as an etch stop and will be only slightly penetrated as shown. The etching can be prolonged to make sure that layer 16 is completely removed inside photoresist openings 19 and 20.

Then, the photoresist 17 is removed and the wafer is subjected to anisotropic etch such as HBr, or $Cl_2$. Oxide layer 16 will act as an etch resist which localizes the material removal to inside openings 19 and 20. First, the exposed layer 15 is removed followed by layer 14. Since layer 14 is very thin with respect to layer 17, only a small thickness of layer 16 will be removed therewith.

Then, the exposed silicon is rapidly removed in the anisotropic etch to produce the structure of FIG. 3.

It is to be understood that in an etching system where the photoresist will not create contamination problems, it can be left in place during the anisotropic etch. In this case, the photoresist will act in conjunction with layer 16 to localize the etching.

As shown in FIG. 3, the etching is continued until the P type substrate wafer 11 is penetrated. This trench depth is typically on the order of 6–7 microns, as determined by the thicknesses of the layers required by the particular transistors being produced.

Then, as shown in FIG. 4, layer 17 is selectively removed in a wet etch, typically comprising hydrofluoric acid or ammonium bifluoride, as is well known in the art. Such an etch will attack the oxide rapidly and the silicon slowly. This removes all traces of the oxide and also removes the silicon surface damage caused by the anisotropic etch. Thus, it produces a chemically clean structure.

Then, as shown in FIG. 4, a thermal oxide, a few hundred angstroms thick, is grown on the exposed silicon. During this oxidation, layers 14 and 15 will mask the upper silicon surfaces. This thin oxide 22 conditions the silicon for the next step.

At this point, as shown in FIG. 5, a spacer oxide 23 is applied to the structure to creatre a CVD layer about 2000 Å thick. While not shown herein, if desired, oxide spacer 23 could be replaced or overcoated with a layer of silicon nitride. It is important that layer 23 be made thick enough to provide the desired spacer, but should not be thick enough to fill the narrowest trench.

Then, the wafer is subjected to an anisotropic etch to remove the upper portions of layer 23. This exposes the silicon inside the trenches as shown in FIG. 6. The presence of layer 15 will mask this etch over the wafer portions between the trenches.

The next step involves exposing the wafer to a conventional impurity diffusion cycle in which an oxidizing atmosphere containing a P type dopant, such as boron, is present. The exposed silicon will then be doped P+, as shown at regions 24 and 25 in FIG. 6. This diffusion can be carried out in a nonoxidizing atmosphere. However, if performed in an oxygen containing atmosphere any oxide formed in this diffusion can be removed in an HF wash following the heat cycle. Typically, P+ regions 24 and 25 will have a surface impurity concentration of about $10^{18}$ atoms/$cm^3$ and will be about 2000 Å thick. It will be noted that the P+ regions extend part way under the spacer oxide 23. Clearly, if desired, the P+ impurity could be applied by ion implantation followed by a diffusion heat treatment.

After the formation of the P+ regions 24 and 25, and the surface cleaning step, the wafer is subjected to a conventional selective epitaxial silicon deposition process step. This causes silicon to grow epitaxially onto only the silicon surface exposed in the bottom of the trenches. This is known as selective epitaxial growth (SEG). As shown in FIG. 7, this results in regions 26 and 27 composed of grown single crystal trench plugs. Desirably, the grown single crystal plugs 26 and 27 are lightly doped N type, but they are nearly intrinsic so that they are of very high resistivity. Typically, the N type plugs are of about $10^{14}$ ohm centimeter conductivity. Thus, plugs 26 and 27, respectively, form PN junctions with regions 24 and 25. When these junctions are reverse biased, the resulting depletion region will extend mainly into the near-intrinsic plugs. Thus, if desired, variable capacitance diodes can be obtained having quite large capacitance versus voltage variation characteristics.

As shown in FIG. 7, the trenches are substantially filled with epitaxial silicon which should be applied to a level that is close to the top surface of layer 13. Then, an optional thin layer 28 of silicon dioxide is grown on the deposited silicon. This layer, while shown in FIG. 8, can be omitted if there is no chance of unintentionally doping the silicon trench plugs 26 and 27.

Then, oxide layer 29 is applied in a CVD system to a thickness of about 2000 Å. Oxide 29 is mainly silicon dioxide, but additional oxide components are included to reduce its melting temperature. As a practical matter, it is a low melting glass layer. For example, the inclusion of about 5% phosphorous and 3% boron oxide to silicon dioxide will reduce the melting temperature to less than 900° C.

A layer of photoresist 31 is then spun onto the wafer to a thickness of about a micron. It, therefore, fills the depressions in layer 29 over the filled trenches. This is followed by a dry etch cycle which acts equally on photoresist and silicon dioxide to produce the structure of FIG. 9. The final structure is highly planarized. Ideally, the surface of original oxide layer 14 is exposed as shown and the silicon plug oxide 28 is overcoated with remnant portions of layer 29 which provide a final planar surface. It is to be understood that, if desired, the well-known chemical/mechanical planarization (CMP) can be used to planarize layer 29.

The wafer structure of FIG. 9 is ideal for the further construction of components to create VLSI elements, such as transistors, diodes, capacitors and resistors, by well known conventional means. The silicon-filled trenches provide excellent isolation. Furthermore, when planar metallization is applied over the silicon-filled trenches, its stray capacitance is reduced to a minimal value. This characteristic is useful in providing improved circuit performance at high frequencies. Active devices can be conventionally constructed in the regions between trenches and, if desired, active devices can also be incorporated into the silicon plugs filling the trenches. For example, if a PN junction capacitor is fabricated into the silicon trench filling, its change in capacitance versus voltage characteristic is relatively large, thereby producing a voltage-variable capacitance element useful in electronic tuning systems.

The invention has been described and a preferred process detailed. Alternatives have also been described. When a person skilled in the art reads the foregoing description, other alternatives and equivalents, within the spirit and intent of the invention, will be apparent. Accordingly, it is intended that the scope of the invention be limited only by the claims that follow.

I claim:

1. A process for forming isolation trenches in the surface of a silicon semiconductor wafer comprising:

creating a first layer of relatively thin silicon dioxide on said wafer;
depositing a second layer of silicon nitride on top of said first layer;
depositing a third layer of relatively thick silicon dioxide on top of said second layer;
coating said wafer with a photoresist having openings where said trenches are to be created;
removing said third layer exposed in said openings in said photoresist;
subjecting said wafer to a first anisotropic etch to create said trenches;
depositing a spacer silicon dioxide layer over said wafer;
subjecting said wafer to a second anisotropic etch which removes said spacer oxide except where it exists on the walls of said trenches thereby exposing the silicon at the bottoms of said trenches;
subjecting said wafer to a selective silicon epitaxial growth step in which single crystal silicon is grown inside said trenches; and
halting said epitaxial growth when said trenches are substantially filled with silicon.

2. The process of claim 1 wherein said selective silicon epitaxial growth is operated to deposit near intrinsic silicon having a conductivity type opposite to that of said wafer at the bottom of said trenches.

3. The process of claim 2 further including the step of subjecting said wafer to an impurity diffusion step just prior to said selective epitaxial growth step wherein an impurity is deposited into the silicon at the bottoms of said trenches.

4. The process of claim 3 wherein said impurity is selected to dope said silicon to produce the same conductivity type, but of a greater conductivity.

5. The process of claim 1 wherein the step of depositing a spacer silicon dioxide layer is immediately preceded by the step of creating a relatively thin oxide on the silicon surfaces exposed by said first anisotropic etch step.

6. The process of claim 1 wherein said photoresist is retained to act in conjunction with said third layer as the etch resist for said first anisotropic etch step.

7. The process of claim 1 wherein said first anisotropic etch step is immediately preceded by the removal of said photoresist thereby exposing said third layer to act as the etch resist for said first anisotropic etch step.

8. The process of claim 1 further comprising the steps:

depositing a planarizing oxide over the surface of said wafer to a depth that exceeds the wafer surface irregularities;
depositing a planarizing photoresist over said planarizing oxide, said planarizing photoresist being selected to have the same etch rate as said planarizing oxide; and
removing the surface layers from said wafer down to said first layer whereby said wafer presents a planar surface.

* * * * *